United States Patent [19]

Barone et al.

[11] Patent Number: 4,733,115

[45] Date of Patent: Mar. 22, 1988

[54] ELECTRIC MOTOR

[75] Inventors: Michael J. Barone, Spenceport; David L. White, Rochester, both of N.Y.

[73] Assignee: Eastman Kodak Company, Rochester, N.Y.

[21] Appl. No.: 942,121

[22] Filed: Dec. 16, 1986

[51] Int. Cl.$^4$ .............................................. H02K 11/00
[52] U.S. Cl. .................................. 310/68 R; 310/184; 310/207; 310/268; 361/400
[58] Field of Search ............... 310/268, 184, 156, 180, 310/68 R, 108, 68 B, 254, 46, 207, DIG. 6; 361/400, 403, 414; 318/254

[56] References Cited

U.S. PATENT DOCUMENTS

| | | | |
|---|---|---|---|
| 3,346,689 | 10/1967 | Parstorfer | 361/414 |
| 3,891,905 | 6/1975 | Muller | 310/68 R |
| 4,125,792 | 11/1978 | Schmider | 310/268 |
| 4,181,867 | 1/1980 | Muller | 310/68 R |
| 4,322,490 | 3/1982 | Molaire | 430/281 |
| 4,340,833 | 7/1982 | Sudo | 310/207 |
| 4,342,151 | 8/1982 | Guild | 29/827 |
| 4,359,277 | 11/1982 | Shimizu et al. | 354/219 |
| 4,394,594 | 7/1983 | Schmider | 310/68 R |
| 4,464,704 | 8/1984 | Huie | 361/414 |
| 4,574,211 | 3/1986 | Muller | 310/68 R |
| 4,594,524 | 6/1986 | Sudo | 310/207 |
| 4,658,162 | 4/1987 | Koyama | 310/DIG. 6 |
| 4,658,332 | 4/1987 | Baker | 361/403 |

FOREIGN PATENT DOCUMENTS 9564  1/1983  Japan ........................... 310/DIG. 6

Primary Examiner—R. Skudy
Attorney, Agent, or Firm—Donald D. Schaper

[57] ABSTRACT

An electric motor is disclosed which is of the brushless DC type and comprises a generally planar rotor and a generally planar stator. The rotor is a multipolar permanent magnet and is adapted is rotate with a driven element. The stator includes a motor coil and a control section having control elements for regulating current in the coil. In order to provide a motor which has an improved arrangement for connecting the coil to the control elements and is relatively inexpensive to manufacture, the motor coil is formed integrally with the control section, and the control elements are connected to a conductor pattern in the control section.

7 Claims, 14 Drawing Figures

ELECTRIC MOTOR

FIELD OF THE INVENTION

The present invention relates to an electric motor, and more particularly, to a brushless DC motor of the planar type.

DESCRIPTION OF PRIOR ART

Compact, inexpensive electronic actuators, such as DC motors, are employed in a wide variety of consumer products. In many such applications, a thin, flat actuator is used in order to conserve space. It is known to form these actuators by printed circuit techniques in which copper layers, formed on a dielectric material, are etched to produce a desired configuration such as a coil. A component for an actuator of this type is disclosed in U.S. Pat. No. 4,340,833.

U.S. Pat. No. 4,340,833, discloses an armature for a miniature motor in which spiral coils are arranged on opposite sides of an insulating sheet. The coils in the armature are connected in series, and the inner ends of opposing coils are connected to each other through the insulating sheet. The connections of the inner ends are made by spot welding. A problem with using coils of the type shown in this patent is that they must be mounted on a support, such as a printed circuit board, and then connected to the drive electronics for the motor. Such an arrangement increases the complexity and expense of the motor and also increases the possibility of malfunction due to a faulty connection.

SUMMARY OF THE INVENTION

It is an object of the present invention to overcome the problems in the prior art and to provide an improved motor which is relatively inexpensive to manufacture.

In accordance with one aspect of the invention, there is provided an electric motor comprising: a generally planar rotor adapted to be rotated about an axis, the rotor being a multipolar permanent magnet; a generally planar stator axially spaced from the rotor, the stator including a motor coil disposed opposite the rotor and a control section formed integrally with the coil, the stator having a conductor layer extending through the coil and the control section, the conductor layer comprising elements of the coil and a conductor pattern in the control section which is electrically connected to the coil elements; and control elements connected to the conductor pattern to control current in the coil elements.

In one embodiment of the present invention, the motor includes a stator having a multilayer coil which is integrally formed with a multilayer control section. Electronic components are joined to a conductor pattern on a top layer of the control section to provide a means for regulating current to the coil. The stator is supported on a base plate, and a multipolar rotor is mounted for rotation closely adjacent the stator.

A principal advantage of the present invention is that it makes it possible to eliminate separate circuit boards and coil connectors in a planar motor of the type disclosed herein. As a result of forming the motor coil and the control section as a single unit, the motor can be made more compact and with less expense than in known motor constructions. The integrally-formed conductor patterns in the control section have a low resistance, and they are not subject to coming loose during usage. Further, the printed conductor patterns facilitate the precise location of certain elements, such as the Hall sensors, which improves the performance of the motor.

Other features and advantages will become apparent from reference to the following Description of the Preferred Embodiment when read in light of the attached drawings.

DESCRIPTION OF THE PREFERRED EMBODIMENT

Figure 1:
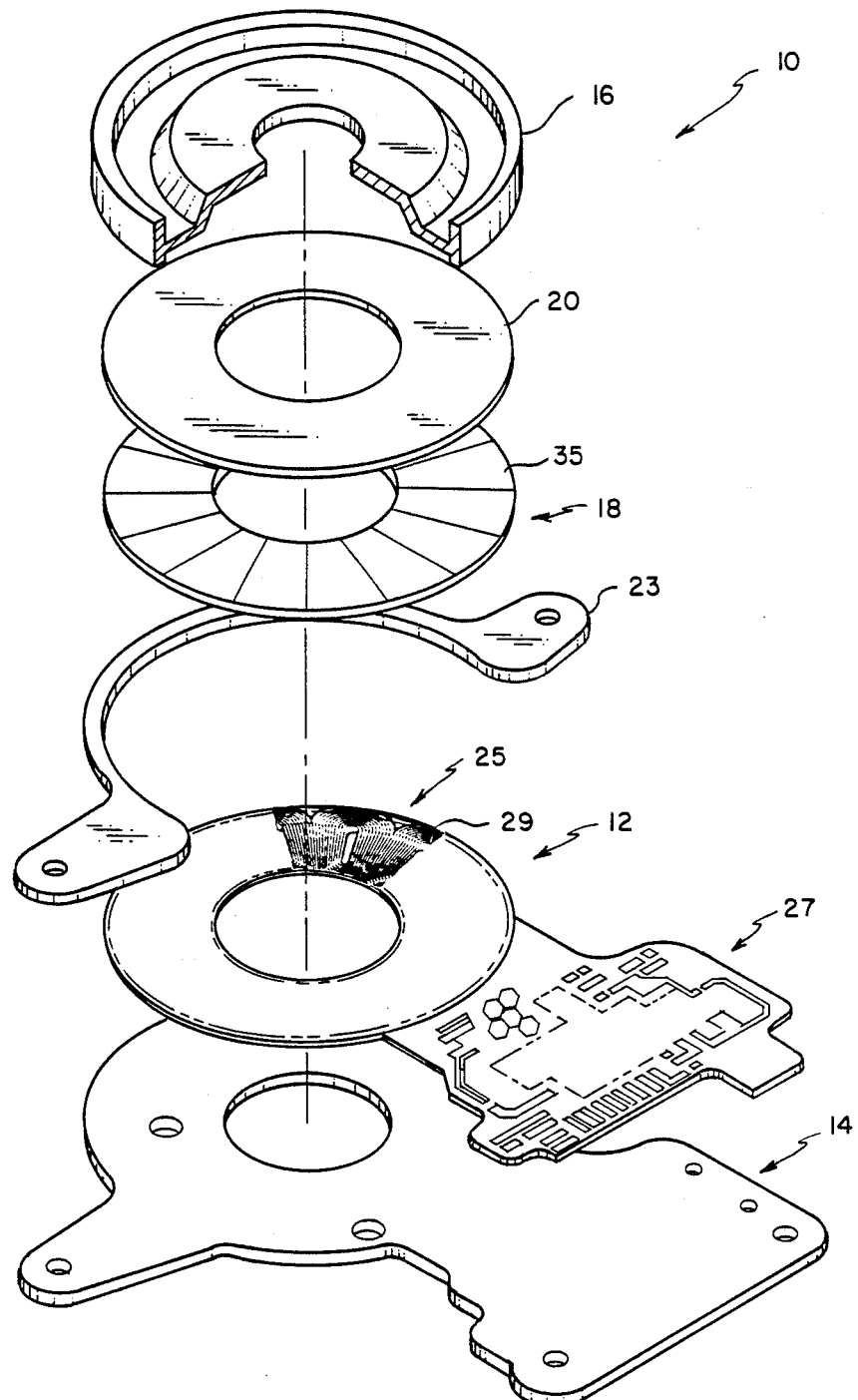
FIG. 1 is an exploded perspective view of the motor of present invention in which the electronic control elements have been omitted.

With reference to FIG. 1, there is shown a brushless DC motor 10 constructed in accordance with the present invention. Motor 10 comprises a stator 12, a base plate 14 which also serves as a bottom flux plate, a hub 16, a rotor 18, a top flux plate 20 and a guard 23. Stator 12 includes a motor coil 25 and a control section 27. Motor 10, as described herein, is a three-phase, brushless DC motor.

Rotor 18 is a multipolar permanent magnet which includes sixteen poles 35. The permanent magnet of rotor 18 interacts with a magnetic field produced by coil 25 when a current is supplied thereto to produce rotation of rotor 18. Both the poles 35 and coil elements 29 of coil 25 are shaped as sectors so that the flux generated by a pole 35 effectively meets a coil element 29.

Figure 2:
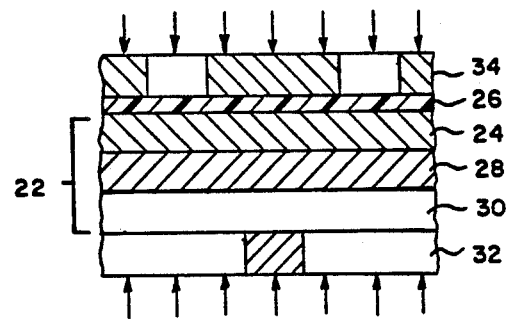
FIGS. 2-11 show the formation of the various layers of the motor stator.

Stator 12 can be made by a process disclosed in a commonly-assigned patent application, Ser. No. 942,122, entitled Method of Making An Electronic Component, filed on even date herewith. As disclosed therein, an element in the form of a laminate 21 (FIG. 6) is made in a first part of the process. To form laminate 21, a multilayer blank 22 (FIG. 2) is used as a starting material. Blank 22 comprises a conductor layer in the form of a copper layer 24, a layer 26 of positive resist adhered to one side of layer 24, and a dielectric layer 28 which is a negative resist adhered to an opposite side of layer 24. A removable cover sheet 30 is placed over layer 28. Layer 24 can be any electrically-conductive metal; however, a preferred metal is copper. Positive resist layer 26 can be, for example, Kodak 809 positive resist, available from Eastman Kodak Co., Rochester, N.Y. The negative resist of layer 28 can be a photopolymerizable plastic as disclosed, for example, in commonly-assigned U.S. Pat. No. 4,322,490, granted Mar. 30, 1982, and this patent is expressly incorporated herein by reference. Cover sheet 30 can be formed, for example, from polyethylene terephthalate, obtainable from Eastman Kodak Co. under the trademark "Estar."

A blank 22 of a type which can be used in the present invention is shown in U.S. Pat. No. 4,342,151, granted Aug. 3, 1982. Suitable thicknesses for the various layers in blank 22 are 0.002-0.005 inches for layer 26, 0.0007-0.006 inches for layer 24, 0.0005-0.005 inches for layer 28, and 0.001 inches for sheet 30.

In a first step of the process of forming stator 12 (FIG. 2), layer 28 is exposed with ultraviolet light through a mask 32, and the layer 26 is simultaneously exposed with ultraviolet light through a mask 34. The ultraviolet light can be provided by mercury vapor lamps.

Figure 3:
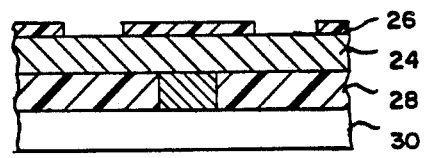
Figure 4:
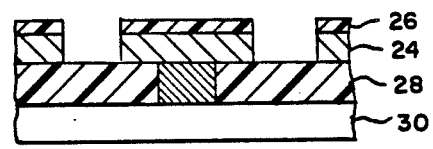

In the next step, as shown in FIG. 3, the positive resist layer 26 is developed using, for example, Kodak 809 developer in a 50% solution at about 30° C. The copper layer 24 is then etched (FIG. 4) to form a desired conductor pattern in layer 24. The copper layer 24 is etched using a solution of 2 M CuCl 2H$_2$O and 2 M HCl, the solution having a pH of approximately minus 1.

Figure 5:
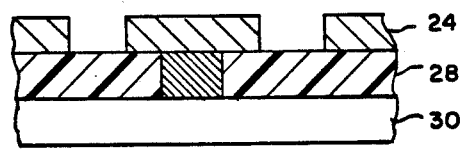
Figure 6:
Figure 7:
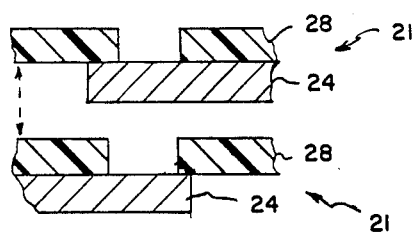

After the etching of the copper layer 24, the resist layer 26 is stripped off, using a 5% solution of sodium hydroxide (pH of approximately 13.6), leaving the combination shown in FIG. 5. The cover sheet 30 is then removed, and the unexposed negative resist of layer 28 is developed in a 1,1,1-trichloroethane solution to produce a laminate 21 (FIG. 6).

Figure 8:
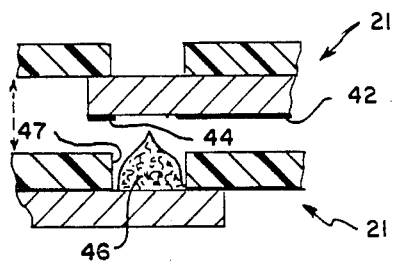
Figure 9:
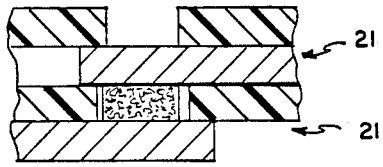
Figure 10:
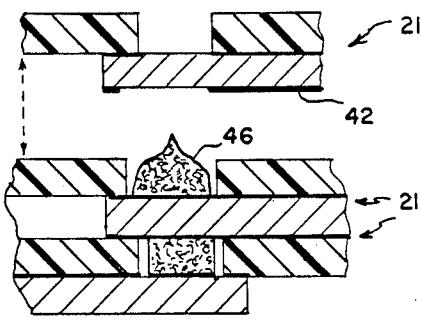
Figure 11:
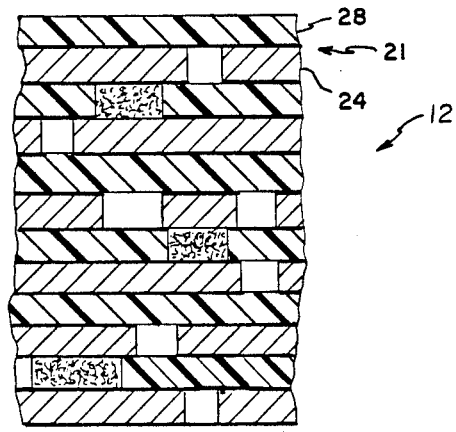

As shown in FIGS. 7-11, laminates 21 are assembled together to form stator 12 having a plurality of copper layers 24. With reference to FIG. 8, a dielectric adhesive 42 is screen printed on a copper layer 24 of a laminate 21 in a pattern such that selected areas 44 of the conductive copper material are exposed. On a second laminate 21, a conductive paste 46 is applied to copper layer 24 through openings 47 in layer 28. The conductive paste 46 is a pliable material which can be screen printed onto the layer 24; however a preferred method is to dispense the paste into openings 47. Laminates 21 are then joined, as shown in FIG. 9. These steps are repeated (FIG. 10) to form stator 12 having six laminates 21, as shown in FIG. 11. When the stator 12 has been fully formed, it is cured for 10-60 minutes at a temperature of between about 150° C. and about 200° C. During the curing step, the laminates 21 of stator 12 are pressed together with a light pressure of 2-5 psi.

The dielectric adhesive 42 can be, for example, Cermalloy CL84-5133 dielectric adhesive, available from Heraeus-Cermalloy, West Conshohocken, Pa. The conductive paste 46 can be a thermoplastic containing conductive particles or an epoxy plastic containing conductive particles. The conductive particles can be, for example, silver or copper particles. A preferred conductive paste is Marpoxy 98-240 paste which contains copper particles and is obtainable from Key Polymer Company. Other suitable conductive pastes are a conductive epoxy obtainable from Heraeus-Cermalloy under the tradename Cermalloy CL20-5328, and Amicon C9901 obtainable from the Amicon Company. An important consideration in selecting the dielectric adhesive 42 and the conductive paste 46 is that they not contain solvents which would react with the other materials in laminate 21.

When stator 12 is formed, each laminate 21 comprises a dielectric layer 28 and a copper layer 24 which is formed into a plurality of coil elements 29 and a conductor pattern 37 (FIG. 1). Motor coil 25 includes six copper layers 24 (FIG. 11), and each of the copper layers 24 is separated by a dielectric layer 28. Each copper layer 24 includes a set of sixteen coil elements 29 (FIG. 12), and in a top pair of copper layers 24, when the layers are oriented as shown in FIG. 11, the coil elements 29 are superposed and are connected in series to form one phase of motor 10. Similarly, the coil elements 29 in a middle pair of copper layers 24 are superposed and connected in series to form a second phase of motor 10, and the coil elements 29 in a bottom pair of layers 24 are superposed and connected in series to form a third phase of motor 10. The coil elements 29 included in each phase are displaced 15 degrees in a circumferential direction with respect to adjacent coil elements 29 included in another phase; that is, the coil elements 29 in the top pair of layers 24 are displaced 15 degrees with respect to the coil elements 29 in the middle pair of layers 24, and the coil elements 29 in the middle pair of layers 24 are displaced 15 degrees with respect to the coil elements 29 in the bottom pair of layers 24.

Figure 12:
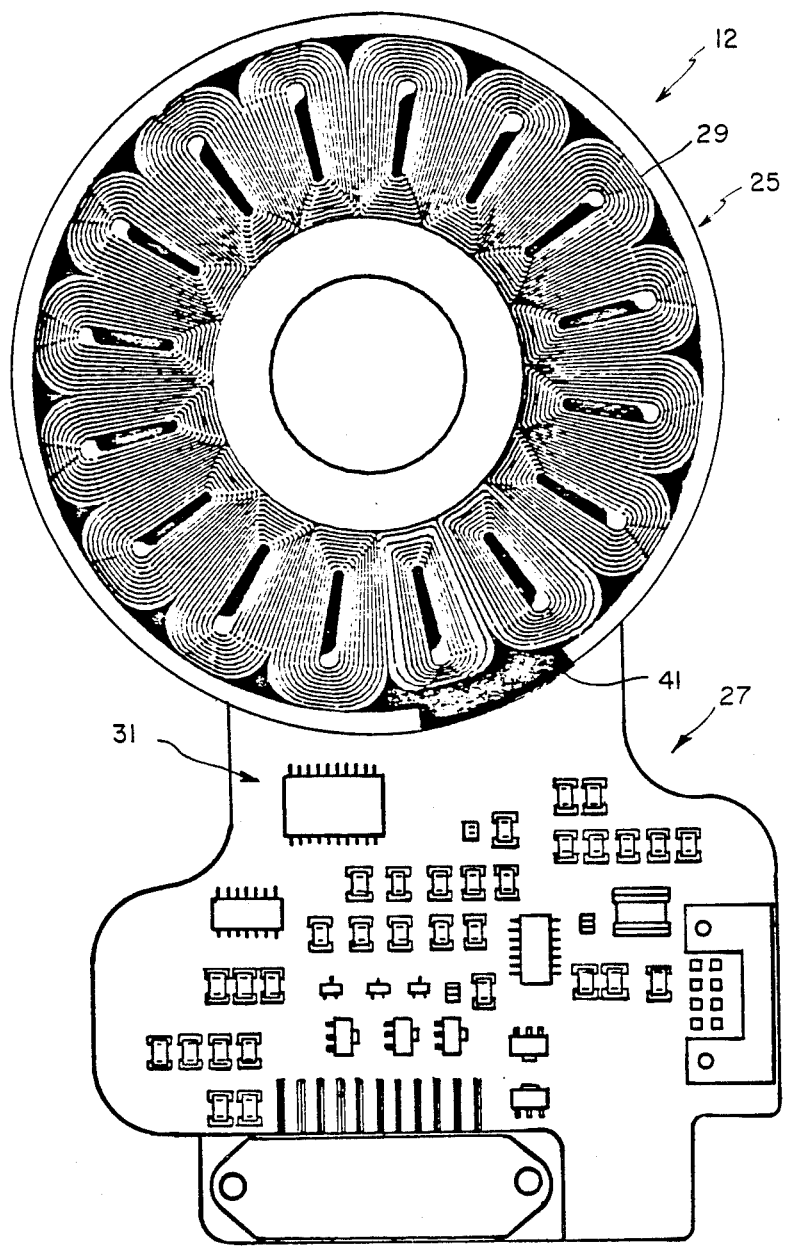
FIG. 12 is a plan view of the motor stator, showing the arrangement of the electronic control elements.
Figure 13:
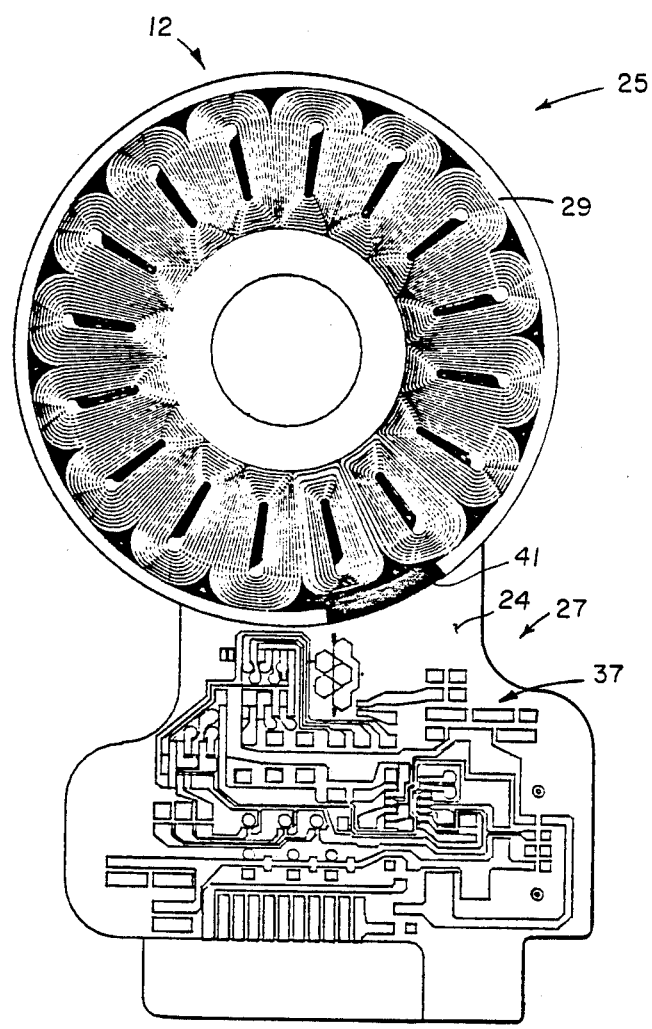
FIG. 13 is a plan view of the motor stator, showing the conductor pattern in the control section of the stator.

Control section 27 is formed from the same copper layers 24 and dielectric layers 28 that make up motor coil 25. As shown in FIG. 13, section 27 includes conductor patterns 37, formed in layers 24, and as shown in FIG. 12, control section 27 includes on a top layer thereof electronic control elements 31 which are necessary to control the flow of current to the three phases of motor 10. In FIG. 12, conductor pattern 37 has been omitted to more clearly show the arrangement of elements 31. In FIG. 13, a copper layer 24 of stator 12 is shown which includes coil elements 29 and a conductor pattern 37 for forming the electrical connections between motor coil 25 and the electronic control elements 31 shown in FIG. 12. It will be understood that each of the other copper layers 24 in control section 27 contains a conductor pattern 37 and that all of the conductor patterns 37 are electrically connected to form part of a motor drive circuit. Each of the conductor patterns 37 is formed such that a substantial portion of copper remains in a layer 24 in order to give rigidity to the stator 12.

The motor drive ciruit (not shown), which controls the current to motor coil 25 and includes control elements 31, does not form a part of the present invention, and thus, a detailed explanation of the circuit will not be given herein. The electronic control elements 31 are integrated circuit chips having input and output pins which are connected to the conductor patterns 37 in the layers 24. The control elements 31 can be joined to a conductor pattern 37 in the control section 27 by any suitable material. One suitable material is a conductive paste in the form of a silver-loaded epoxy. Another suitable material is a reflow solder. Also, it is possible to use a thermosetting plastic; when a thermosetting plastic is used, a particular component can be replaced by simply applying sufficient heat to soften the connector material and then removing the defective component.

As shown in FIG. 13, terminals 41 are provided in a conductor pattern 37 in a layer 24 for receiving Hall sensors (not shown). As is well known in the art, these sensors sense the angular position of rotor 18 in order to control the commutation of current between the individual phases of motor 10. When the Hall sensors are mounted on terminals 41, they are precisely located relative to rotor 18. The sensors are arranged to fit under a tapered portion 43 of rotor 18 (FIG. 14), and in this position, they are in an optimum location to sense the angular position of the rotor 18.

Figure 14:
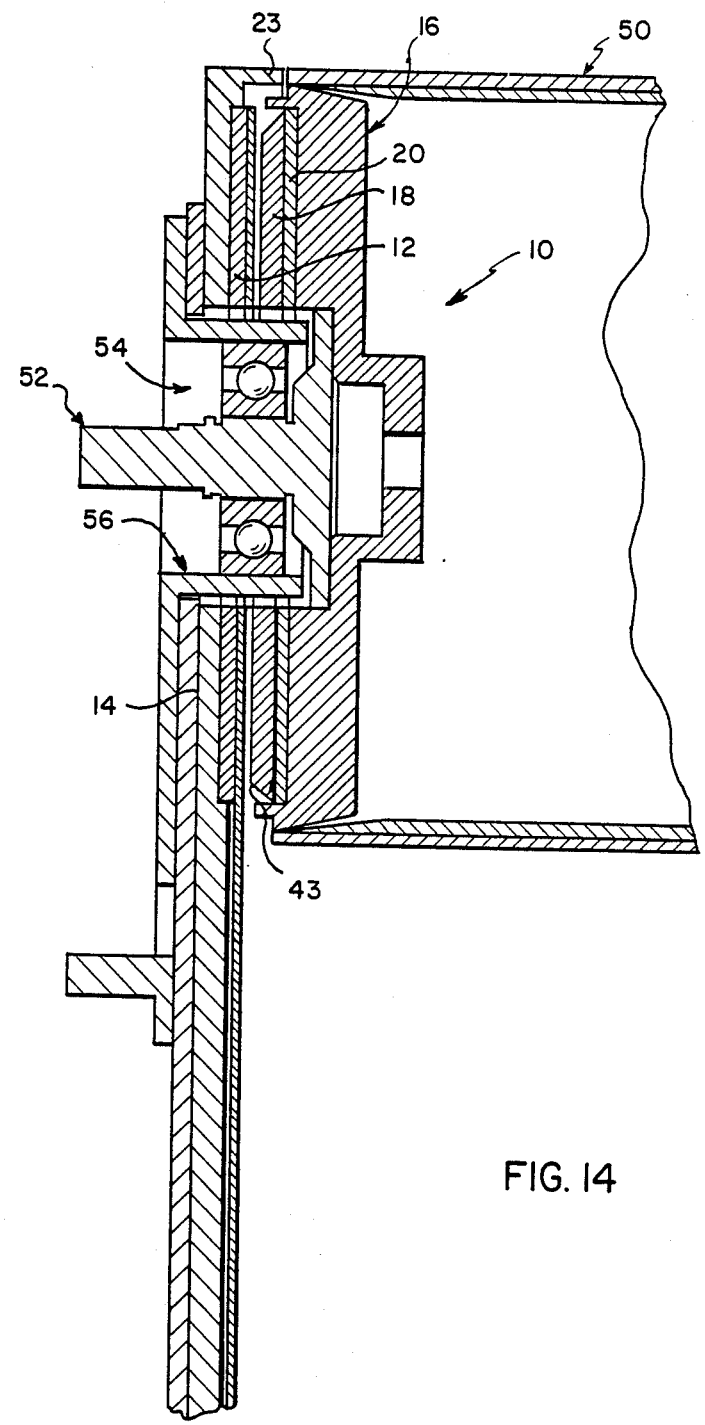
FIG. 14 is an elevational view, in section, of the motor of the present invention and a cylinder driven thereby.

With reference to FIG. 14, there is shown one application of the present invention in which motor 10 is mounted to drive a cylinder 50. Hub 16, flux plate 20, and rotor 18 are fixed to the cylinder 50 and are adapted to rotate therewith. A shaft 52 fixed to hub 16 is supported in a bearing 54 which is mounted in a frame element 56. Stator 12 and base plate 14 are also mounted on element 56.

The invention has been described in detail with particular reference to certain embodiments thereof, but it will be understood that variations and modifications can be effected within the spirit and scope of the invention.

What is claimed is:

1. An electric motor comprising:
   a generally planar rotor adapted to be rotated about an axis, said rotor being a multipolar permanent magnet;
   a generally planar stator axially spaced from said rotor, said stator including a motor coil disposed opposite said rotor and a control section formed integrally with said coil and extending from one side thereof, said stator including a conductor layer having a first portion in said coil and a second portion in said control section, said conductor layer comprising elements of said coil formed in said first portion and a conductor pattern formed in said second portion which is electrically connected to said coil elements and formed integrally therewith; and
   control elements supported on said control section and connected to said conductor pattern to control current in said coil elements.

2. An electric motor, as defined in claim 1, wherein said stator comprises a second conductor layer which includes coil elements and a conductor pattern, and all of said coil elements are connected in series to form one phase of said motor.

3. An electric motor, as defined in claim 2, wherein said motor includes third and fourth conductor layers having coil elements and conductor patterns therein, and the coil elements in said third and fourth conductor layers form a second phase of said motor.

4. An electric motor, as defined in claim 3, wherein said motor includes fifth and sixth conductor layers having coil elements and conductor patterns therein, and the coil elements in said fifth and sixth layers form a third phase of said motor.

5. An electric motor, as defined in claim 1, wherein said motor comprises three pairs of conductor layers, each layer containing a set of coil elements, and the coil elements in each pair of layers being connected in series to form one phase of said motor.

6. An electric motor, as defined in claim 1, wherein said stator is supported on a base plate, and said base plate serves as a flux plate for said motor.

7. A three-phase, brushless DC motor comprising:
   a generally planar rotor in the form of a multipolar permanent magnet, said rotor being supported for rotation about an axis;
   a multilayer generally planar stator disposed opposite said rotor and axially spaced therefrom, said stator including a motor coil and a control section located at one side of said coil;
   said motor coil including three pairs of conductor layers, each pair of layers including a plurality of coil elements formed in the layers and connected in series to form one phase of said motor;
   said control section including said conductor layers, each of the conductor layers in the control section having a conductor pattern which is integrally formed with coil elements therein, and means for connecting said conductor patterns such that current can be supplied to each of said phases; and
   control elements supported on said control section and connected to one of said conductor patterns for regulating the flow of current to said phases.

* * * * *